United States Patent
Joo (10) Patent No.: US 8,067,977 B2
(45) Date of Patent: Nov. 29, 2011

(54) VOLTAGE GENERATING CIRCUIT AND SEMICONDUCTOR DEVICE HAVING THE SAME

(75) Inventor: Jong-Doo Joo, Seongnam-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 26 days.

(21) Appl. No.: 12/385,388

(22) Filed: Apr. 7, 2009

(65) Prior Publication Data

US 2009/0261892 A1   Oct. 22, 2009

(30) Foreign Application Priority Data

Apr. 18, 2008   (KR) .................. 10-2008-0036119

(51) Int. Cl.
*G05F 1/10* (2006.01)
*G05F 3/02* (2006.01)
(52) U.S. Cl. ....................................... 327/536
(58) Field of Classification Search .......... 327/535–537; 363/59–60
See application file for complete search history.

(56) References Cited

U.S. PATENT DOCUMENTS

| | | | | |
|---|---|---|---|---|
| 5,337,284 A * | 8/1994 | Cordoba et al. | ............... | 365/227 |
| 6,107,863 A * | 8/2000 | Iwata | ............... | 327/536 |
| 6,501,326 B2 * | 12/2002 | Fujii et al. | ............... | 327/536 |
| 7,304,530 B2 * | 12/2007 | Wei et al. | ............... | 327/536 |
| 2006/0192607 A1 * | 8/2006 | Chun et al. | ............... | 327/536 |
| 2009/0201076 A1 * | 8/2009 | Namekawa et al. | ............... | 327/536 |

FOREIGN PATENT DOCUMENTS

| | | | |
|---|---|---|---|
| JP | 08-162915 | | 6/1996 |
| JP | 11032476 A | * | 2/1999 |
| KR | 10-1998-041578 | | 8/1998 |
| KR | 10-2002-0057053 | | 7/2002 |

OTHER PUBLICATIONS

Translation of JP 11-032476.*
Abstract of KR 10-0238867 published on Oct. 16, 1999.

* cited by examiner

*Primary Examiner* — Quan Tra
(74) *Attorney, Agent, or Firm* — Harness, Dickey & Pierce, P.L.C.

(57) ABSTRACT

An active charge pump circuit may include a charge pump circuit, a control circuit, and a charge transfer circuit. The charge pump circuit may generate a charge pumping voltage in response to an active enable signal. The control circuit may generate a charge transfer control signal varying between a ground voltage and a boosted power supply voltage that is twice as much as a power supply voltage in response to the active enable signal. The charge transfer circuit may output the charge pumping voltage as an active voltage in response to the charge transfer control signal.

28 Claims, 6 Drawing Sheets

VOLTAGE GENERATING CIRCUIT AND SEMICONDUCTOR DEVICE HAVING THE SAME

PRIORITY STATEMENT

This application claims priority under 35 USC §119 to Korean Patent Application No. 2008-0036119, filed on Apr. 18, 2008 in the Korean Intellectual Property Office (KIPO), the entire contents of which are incorporated herein by reference.

BACKGROUND

1. Technical Field

Example embodiments relate to a voltage generator, and more particularly, to a voltage generator including an active charge pump circuit and a semiconductor device including the voltage generator.

2. Description of the Related Art

Recently, as a system on a chip (SOC) is developed, the memory devices included in the SOC need to be faster, lighter, and smaller. Therefore, a pseudo static random access memory (PSRAM) is generally used in the SOC. The PSRAM is implemented by embedded dynamic random access memory (eDRAM). A structure of PSRAM is substantially the same as a structure of a DRAM but the PSRAM operates as a SRAM as seen from an exterior. The PSRAM has the high density feature of the DRAM. However, the data cells in the PSRAM may be periodically refreshed to prevent or reduce a data retention failure in a standby mode, and thus, the PSRAM may increase power consumption.

The eDRAM typically requires two types of power supply voltages including a voltage for the standby mode and a voltage for an active mode. To reduce the power consumption, the voltage for the standby mode may be smaller than the voltage for the active mode. Circuit elements included in a voltage generator for generating the voltage for the active mode may be damaged by high operation voltages and also operate unstably due to a variance of a threshold voltage caused by a body effect. Therefore, a voltage generator having increased reliability and efficiency is required.

SUMMARY

Example embodiments provide an active charge pump circuit for improving power factor and reliability. Example embodiments provide a voltage generating circuit including the active charge pump circuit. Example embodiments provide a semiconductor device including the voltage generating circuit.

According to example embodiments, an active charge pump circuit may include a charge pump circuit, a control circuit, and a charge transfer circuit. The charge pump circuit generates a charge pumping voltage in response to an active enable signal. The control circuit generates a charge transfer control signal varying between a ground voltage and a boosted power supply voltage in response to the active enable signal. The boosted power supply voltage is twice as much as a power supply voltage. The charge transfer circuit outputs the charge pumping voltage as an active voltage in response to the charge transfer control signal.

The charge transfer circuit may include at least one p-type metal oxide semiconductor (PMOS) transistor. The at least one p-type PMOS transistor may include a first PMOS transistor, a second PMOS, and a third PMOS transistor. The first PMOS transistor may include a control terminal to which the charge transfer control signal is applied, a first terminal to which the charge pumping voltage is applied, and a second terminal for outputting the active voltage. The second PMOS transistor may include a control terminal coupled to the second terminal of the first PMOS transistor, a first terminal coupled to the first terminal of the first PMOS transistor, and a second terminal coupled to a body of the first PMOS transistor. The third PMOS transistor may include a control terminal coupled to the first terminal of the first PMOS transistor, a first terminal coupled to the second terminal of the first PMOS transistor, and a second terminal coupled to the body of the first PMOS transistor. A body of the second PMOS transistor and a body of the third PMOS transistor may be coupled to the body of the first PMOS transistor.

According to example embodiments, the charge pump circuit may include a first charge pump unit, a second charge pump unit, a first power supply unit, and a second power supply unit. The first charge pump unit may be connected between a first node and a second node and boost a voltage of the second node when the active enable signal is enabled. The second charge pump unit may be connected between the first node and a third node and boost a voltage of the third node when the active enable signal is disabled. The first power supply unit may supply a power supply voltage at the third node in response to the boosted voltage of the second node. The second power supply unit may supply the power supply voltage at the second node in response to the boosted voltage of the third node. The charge pump circuit may include an inverter which inverts the active enable signal and output the inverted active enable signal at the first node.

The control circuit may include a first charge pump unit, a second charge pump unit, a first power supply unit, a second power supply unit, and a switching unit. The first charge pump unit may be connected between a first node and a second node and boost a voltage of the second node when the active enable signal is disabled. The second charge pump unit may be connected between the first node and a third node and boost a voltage of the third node when the active enable signal is enabled. The first power supply unit may supply a power supply voltage at the third node in response to the boosted voltage of the second node. The second power supply unit may supply the power supply voltage at the second node in response to the boosted voltage of the third node. The switching unit may be coupled to the second node and output the charge transfer control signal in response to the active enable signal. For example, the switching unit may include a PMOS transistor and an n-type metal oxide semiconductor (NMOS) transistor. The PMOS transistor may include a control terminal to which the active enable signal is applied, a first terminal coupled to the second node, and a second terminal for outputting the charge transfer control signal.

The NMOS transistor may include a control terminal to which the active enable signal is applied, a first terminal coupled to a ground voltage, and a second terminal coupled to the second terminal of the PMOS transistor. The first charge pump unit may include an inverter and a capacitor. The inverter powered by a power supply voltage may invert the active enable signal. The capacitor may boost the voltage of the second node in response to an output signal of the inverter. The second charge pump unit may include a first inverter, a second inverter, and a capacitor. The first inverter and the second inverter are powered by the power supply voltage. The first inverter may invert the active enable signal and the second inverter may invert an output signal of the first inverter. The capacitor may boost the voltage of the third node in response to an output signal of the second inverter.

The control circuit may further include a buffer which may temporarily hold the active enable signal and output the delayed active enable signal at the first node. For example, the buffer may include at least one inverter powered by the power supply voltage. In example embodiments, the active charge pump circuit may further include an auto pulse generator. The auto pulse generator may adjust a duty ratio of the active enable signal and provide the adjusted active enable signal to the control circuit and the charge pump circuit.

In example embodiments, a voltage generating circuit may include a standby charge pump circuit and an active charge pump circuit. The standby charge pump circuit generates a standby voltage in a standby mode. The active charge pump circuit generates a charge transfer control signal in response to an active enable signal, and thus generates an active voltage in response to the charge transfer control signal varying between a ground voltage and a boosted power supply voltage. The boosted power supply voltage is twice as much as a power supply voltage. The active charge pump circuit may include a charge pump circuit, a control circuit, and a charge transfer circuit. The charge pump circuit may generate a charge pumping voltage in response to the active enable signal. The control circuit may generate the charge transfer control signal. The charge transfer circuit may output the charge pumping voltage as the active voltage in response to the charge transfer control signal. The charge transfer circuit may include at least one PMOS transistor. For example, the at least one PMOS transistor may include a first PMOS transistor, a second PMOS transistor, and a third PMOS transistor. The first PMOS transistor may include a control terminal to which the charge transfer control signal is applied, a first terminal to which the charge pumping voltage is applied, and a second terminal for outputting the active voltage. The second PMOS transistor may include a control terminal coupled to the second terminal of the first PMOS transistor, a first terminal coupled to the first terminal of the first PMOS transistor, and a second terminal coupled to a body of the PMOS transistor. The third PMOS transistor may include a control terminal coupled to the first terminal of the first PMOS transistor, a first terminal coupled to the second terminal of the first PMOS transistor, and a second terminal coupled to a body of the first PMOS transistor.

According to example embodiments, a semiconductor device may include the voltage generating circuit of example embodiments and at least one functional block. The voltage generating circuit may include a standby charge pump circuit generating the standby voltage in a standby mode and an active charge pump circuit generating the active voltage in an active mode. The active charge pump circuit generates a charge transfer control signal in response to an active enable signal, and outputs the active voltage in response to the charge transfer control signal varying between a ground voltage and a boosted power supply voltage. The boosted power supply voltage is twice as much as the power supply voltage. The active charge pump circuit may include a charge pump circuit, a control circuit, and a charge transfer circuit. The charge pump circuit may generate a charge pumping voltage in response to the active enable signal. The control circuit may generate the charge transfer control signal. The charge transfer circuit may output the charge pumping voltage as the active voltage in response to the charge transfer control signal. The charge transfer circuit may include at least one PMOS transistor. The at least one PMOS transistor may include a first PMOS transistor, a second PMOS transistor, and a third PMOS transistor. The first PMOS transistor may include a control terminal to which the charge transfer control signal is applied, a first terminal to which the charge pumping voltage is applied, and a second terminal for outputting the active voltage. The second PMOS transistor may include a control terminal coupled to the second terminal of the first PMOS transistor, a first terminal coupled to the first terminal of the first PMOS transistor, and a second terminal coupled to a body of the first PMOS transistor. The third PMOS transistor may include a control terminal coupled to the first terminal of the first PMOS transistor, a first terminal coupled to the second terminal of the first PMOS transistor, and a second terminal coupled to a body of the first PMOS transistor.

Consequently, the voltage generating circuit according to example embodiments may not only improve reliability of the active elements implementing the circuit but also reduce the power consumption. Moreover, the voltage generating circuit including the active charge pumping circuit may stably generate the active voltage which is higher than the power supply voltage by reducing the body effect.

BRIEF DESCRIPTION OF THE DRAWINGS

Example embodiments will be more clearly understood from the following detailed description taken in conjunction with the accompanying drawings. FIGS. 1-9 represent non-limiting, example embodiments as described herein.

It should be noted that these Figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION OF EXAMPLE EMBODIMENTS

Example embodiments now will be described more fully with reference to the accompanying drawings, in which example embodiments are shown. Example embodiments may, however, be embodied in many different forms and should not be construed as limited to example embodiments set forth herein. Rather, these embodiments are provided so that this disclosure will be thorough and complete, and will fully convey the scope of example embodiments to those skilled in the art. Like reference numerals refer to like elements throughout this application.

It will be understood that, although the terms first, second, etc. may be used herein to describe various elements, these elements should not be limited by these terms. These terms are used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 1:
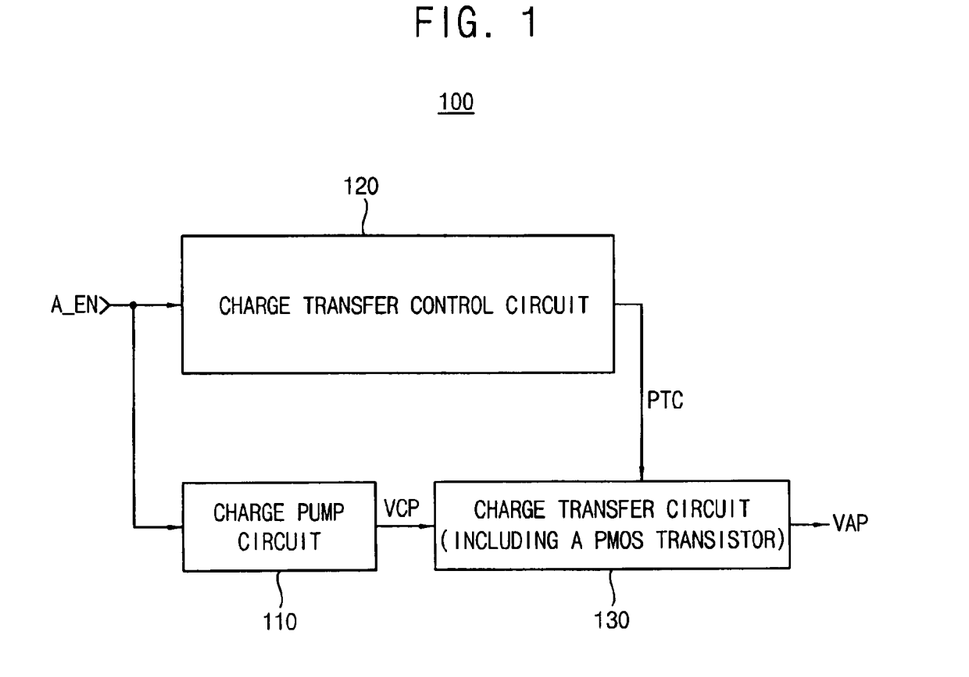
FIG. 1 is a block diagram illustrating an active charge pump circuit according to example embodiments.

FIG. 1 is a block diagram illustrating an active charge pump circuit according to example embodiments. Referring to FIG. 1, an active charge pump circuit 100 may include a charge pump circuit 110, a charge transfer control circuit 120, and a charge transfer circuit 130. The charge pump circuit 110 is configured to generate a charge pumping voltage VCP in response to an active enable signal A-EN. The charge transfer control circuit 120 is configured to generate a charge transfer control signal PTC in response to the active enable signal A_EN. The charge transfer control signal PTC varies between a ground voltage VSS and a boosted power supply voltage BVCC.

The boosted power supply voltage BVCC may be twice as much as the power supply voltage VCC. The charge transfer circuit 130 may include a p-type metal oxide semiconductor (PMOS) transistor and output an active voltage VAP required for an active mode. The active voltage VAP is generally greater than the power supply voltage VCC and the active voltage VAP may have a voltage level of the boosted power supply voltage BVCC. Because the charge transfer circuit 130 is implemented with the PMOS transistor, the charge transfer circuit 130 may operate in response to the charge transfer control signal PTC, a maximum value of which corresponds to the boosted power supply voltage BVCC.

Active elements in the charge transfer control circuit 120 are powered by the power supply voltage VCC and generate the charge transfer control PTC varying between the ground voltage VSS and the boosted power supply voltage BVCC. Because the active elements in the charge transfer control circuit 120 are not powered by a high power supply voltage VPP which is greater than the power supply voltage VCC, the active elements may be protected from damages due to the great voltage transient during an operation. Therefore, the active charge pump circuit 100 according to example embodiments may reliably generate active voltage VAP by boosting the power supply voltage VCC.

Figure 2:
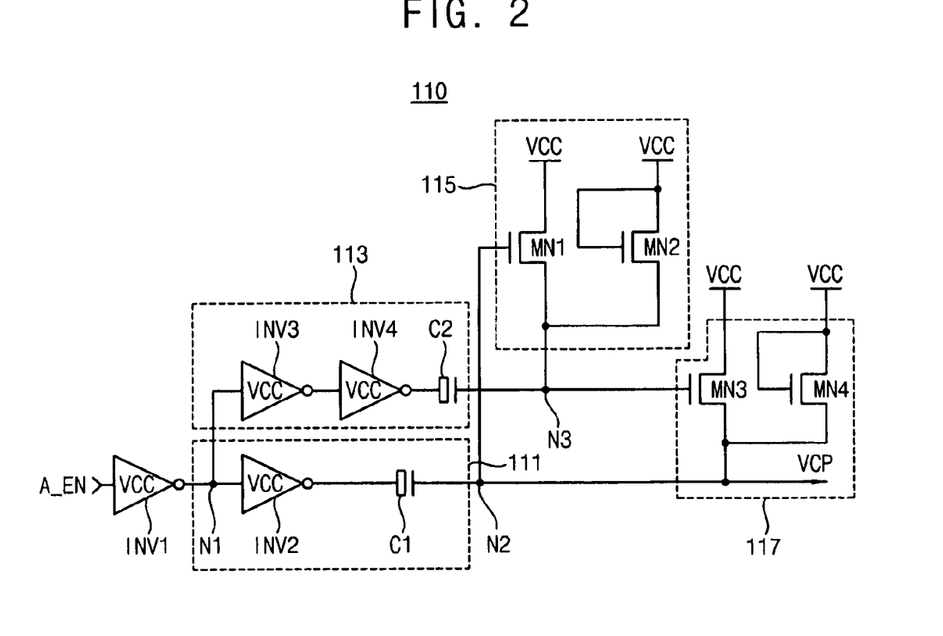
FIG. 2 is a circuit diagram illustrating an example of the charge pump circuit included in the active charge pump of FIG. 1.

FIG. 2 is a circuit diagram illustrating an example of the charge pump circuit included in the active charge pump of FIG. 1. Referring to FIG. 2, a charge pump circuit 110 may include a first charge pump unit 111, a second charge pump unit 113, a first voltage supply unit 115, and a second voltage supply unit 117.

The first charge pump unit 111 is connected between a first node N1 and a second node N2. The first charge pump unit 111 boosts a voltage of the second node N2 when the active enable signal A_EN is enabled to a first state. For example, the first state may correspond to a logic state "high". The second charge pump unit 113 is connected between the first node N1 and a third node N3. The second charge pump unit 113 boosts a voltage of the third node N3 when the active enable signal A_EN is disabled to a second state. For example, the second state may correspond to a logic state "low". The first voltage supply unit 115 applies the power supply voltage VCC at the third node N3 in response to the boosted voltage of the second node N2. The second voltage supply unit 117 applies the power supply voltage VCC at the second node N2 in response to the boosted voltage of the third node N3. The boosted voltage of the third node N3 may correspond to the boosted power supply voltage BVCC that is twice as much as the power supply voltage VCC.

The charge pump circuit 110 may further include a first inverter INV1 that is powered by the power supply voltage VCC. The first inverter INV1 inverts the active enable signal A_EN and outputs the inverted active enable signal at the first node N1. When the active enable signal A_EN is implemented as a low enable signal, the first inverter INV1 may be omitted.

The first charge pump unit 111 may include a second inverter INV2 and a first capacitor C1. The second inverter INV2 inverts an output signal of the first inverter INV1 and is powered by the power supply voltage VCC. The first capacitor C1 boosts the voltage of the second node N2 in response to an output signal of the second inverter INV2, and thus the boosted voltage of the second node N2 may correspond to the boosted power supply voltage BVCC that is twice as much as the power supply voltage VCC.

The second charge pump unit 113 may include a third inverter INV3, a fourth inverter INV4, and a second capacitor C2. The third inverter INV3 inverts the output signal of the first inverter INV1 and is powered by the power supply voltage VCC. The fourth inverter INV4 inverts an output signal of the third inverter INV3 and is powered by the power supply voltage VCC. The second capacitor C2 boosts the voltage of the third node N3 in response to an output signal of the fourth inverter INV4.

The first voltage supply unit 115 may include a first n-type metal oxide semiconductor (NMOS) transistor MN1 and a second NMOS transistor MN2. The first NMOS transistor MN1 may include a control terminal coupled to the second node N2, a first terminal coupled to the third node N3, and a second terminal to which the power supply voltage VCC is applied. The second NMOS transistor MN2 may include a control terminal to which the power supply voltage VCC is applied, a first terminal coupled to the third node N3, and a second terminal to which the power supply voltage VCC is applied.

The second voltage supply unit 117 may include a third NMOS transistor MN3 and a fourth NMOS transistor MN4. The third NMOS transistor MN3 may include a control terminal coupled to the third node N3, a first terminal coupled to the second node N2, and a second terminal to which the power supply voltage VCC is applied. The fourth NMOS transistor MN4 may include a control terminal to which the power supply voltage VCC is applied, a first terminal coupled to the first terminal of the third NMOS transistor MN3, and a second terminal to which the power supply voltage VCC is applied.

Hereinafter, an operation of the charge pump circuit 110 of FIGS. 1 and 2 will be described. The inverters INV1, INV2, INV3, and INV4 included in the charge pump circuit 110 are powered by the power supply voltage VCC. When the active enable signal A_EN is disabled to the second state, for example, when the active enable signal A_EN corresponds to the logic state "low", the voltage of the first node N1 corresponds a logic state "high", and thus, the first charge pump unit 111 does not boost the voltage of the second node N2 and the second charge pump unit 113 boosts the voltage of the third node N3.

While the active enable signal A_EN is enabled to the logic state "high", the voltage of the third node N3 is maintained at the power supply voltage VCC because the third node N3 is powered by the first voltage supply unit 115. When the active enable signal A_EN is disabled to the logic state "low", the second charge pump unit 113 boosts the voltage of the third node N3 in response to the active enable signal A_EN so that the voltage of the third node N3 corresponds to the voltage twice as much as the power supply voltage VCC. When the active enable signal A_EN is disabled to the second state, for example, the logic state "low", the voltage of the second node N2 is maintained at the power supply voltage VCC because the second node N2 is powered by the second voltage supply unit 117.

When the active enable signal A_EN is enabled to the first state, for example, when the active enable signal A_EN corresponds to the logic state "high", a voltage of the first node N1 corresponds the logic state "low", and thus, the first charge pump unit 111 boosts the voltage of the second node N2 and the first charge pump unit 115 boosts the voltage of the third node N3. While the active enable signal A_EN is disabled to the logic state "low", the voltage of the second node N2 is maintained at the power supply voltage VCC because the second node N2 is powered by the second voltage supply unit 117. When the active enable signal A_EN is enabled to the logic state "high", the first charge pump unit 111 boosts the voltage of the second node N2 in response to the active enable signal A_EN, and thus, the voltage of the second node N2 corresponds to the boosted power supply voltage BVCC that is twice as much as the power supply voltage VCC. When the active enable signal A_EN is enabled to the logic state "high", the voltage of the third node N3 is maintained at the power supply voltage VCC because the third node N3 is powered by the first voltage supply unit 115.

Figure 3:
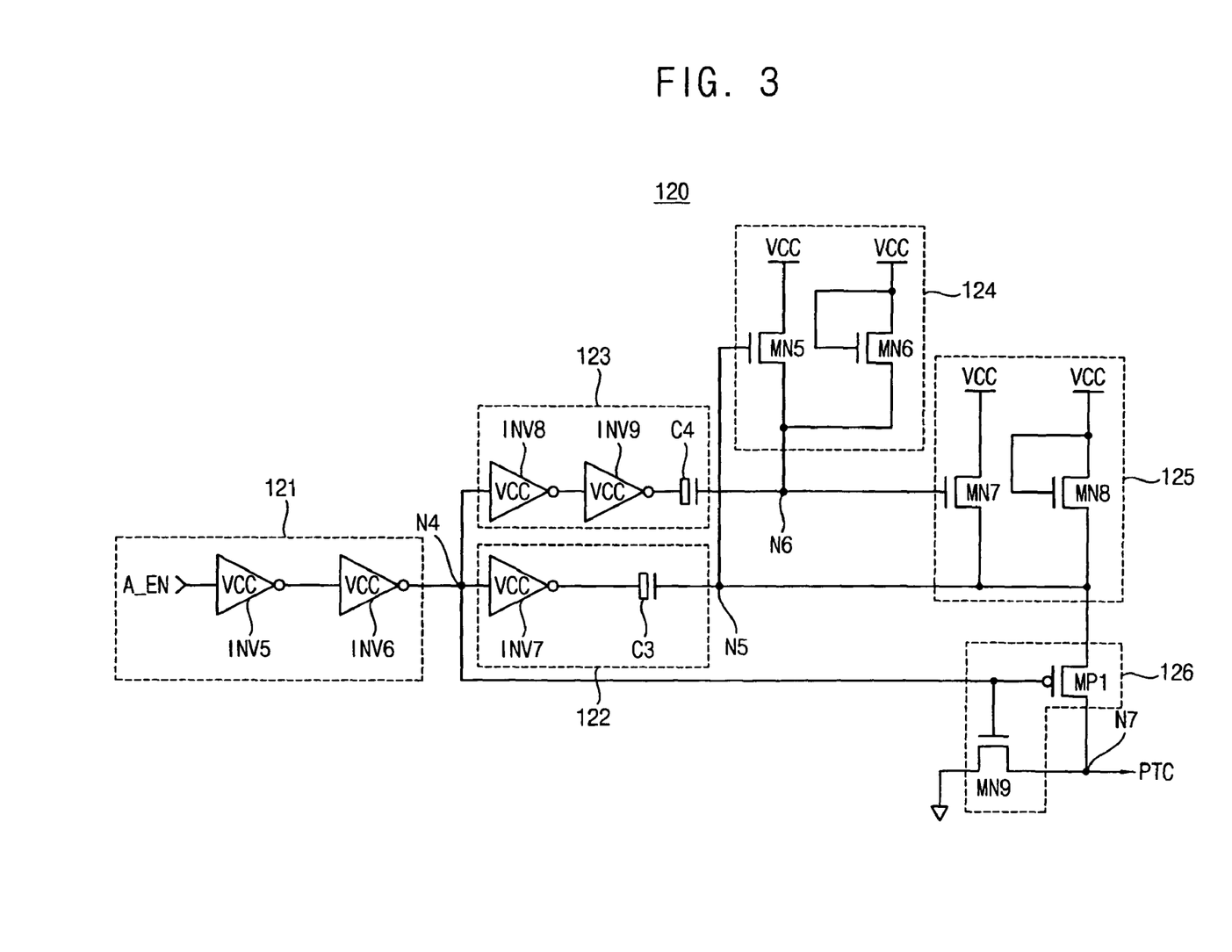
FIG. 3 is a circuit diagram illustrating an example of the charge transfer control circuit included in the active charge pump circuit of FIG. 1.

FIG. 3 is a circuit diagram illustrating an example of the charge transfer control circuit 120 included in the active charge pump circuit of FIG. 1. Referring to FIG. 3, a charge transfer control circuit 120 may include a third charge pump unit 122, a fourth charge pump unit 123, a third voltage supply unit 124, a fourth voltage supply unit 125, and a switching unit 126.

The third charge pump unit 122 is connected between a fourth node N4 and a fifth node N5. The third charge pump unit 122 boosts a voltage of the fifth node N5 when the active enable signal A_EN is disabled to the second state. The fourth charge pump unit 123 is connected between the fourth node N4 and a sixth node N6. The fourth charge pump unit 123 boosts a voltage of the sixth node when the active enable signal A_EN is enabled to the first state. For example, the first state may correspond to the logic state "high" and the second state may correspond to the logic state "low". The third voltage supply unit 124 applies the power supply voltage VCC to the sixth node N6 in response to the boosted voltage of the fifth voltage N5 and the fourth voltage supply unit 125 applies the power supply voltage VCC to the fifth voltage N5 in response to the boosted voltage of the sixth node N6. The switching unit 126 is coupled to the fourth node N4 and the fifth node N5, and outputs the charge transfer control signal PTC in response to a voltage of the fourth node N4 corresponding to the active enable signal A_EN.

The charge transfer control circuit 120 may further include a buffer 121 that is powered by the power supply voltage VCC. The buffer 121 temporarily holds the active enable signal A_EN and outputs a buffered active enable signal. The buffer 121 may include a fifth inverter INV5 and a sixth inverter INV6. The fifth inverter INV5 and a sixth inverter INV6 are serially connected and are powered by the power supply voltage VCC. The buffer 121 may be implemented with a plurality of inverters.

The third charge pump unit 122 may include a seventh inverter INV7 and a third capacitor C3. The seventh inverter INV7 inverts an output signal of the buffer 121 and is powered by the power supply voltage VCC. The third capacitor C3 boosts the voltage of the fifth node N5 in response to an output signal of the seventh inverter INV7.

The fourth charge pump unit 123 may include an eighth inverter INV8, a ninth inverter INV9, and a fourth capacitor C4. The eighth inverter INV8 inverts the output signal of the buffer 121 and is powered by the power supply voltage VCC. The ninth inverter INV9 inverts an output signal of the eighth inverter INV8 and is powered by the power supply voltage VCC. The fourth capacitor C4 boosts a voltage of the sixth node N6 in response to an output signal of the ninth inverter INV9.

The third voltage supply unit 124 may include a fifth NMOS transistor MN5 and a sixth NMOS transistor MN6. The fifth NMOS transistor MN5 may include a control terminal coupled to the fifth node N5, a first terminal coupled to the sixth node N6, and a second terminal to which the power supply voltage VCC is applied. The sixth NMOS transistor MN6 may include a control terminal to which the power supply voltage VCC is applied, a first terminal coupled to the sixth node N6, and a second terminal to which the power supply voltage VCC is applied.

The fourth voltage supply unit 125 may include a seventh NMOS transistor MN7 and an eighth NMOS transistor MN8. The seventh NMOS transistor MN7 may include a control terminal coupled to the sixth node N6, a first terminal coupled to the fifth node N5, and a second terminal to which the power supply voltage VCC is applied. The eighth NMOS transistor MN8 may include a control terminal to which the power supply voltage VCC is applied, a first terminal coupled to the fifth node N5, and a second terminal to which the power supply voltage VCC is applied.

The switching unit 126 may include a first PMOS transistor MP1 and a ninth PMOS transistor MP9. The first PMOS transistor MP1 connects the fifth node N5 and a seventh node N7 in response to the voltage of the fourth node N4, that is the active enable signal A_EN, and thus, charge from the fifth node N5 is transferred to the seventh node N7.

Hereinafter, an operation of the charge transfer control circuit 120 illustrated in FIGS. 1 and 3 will be described. The inverters INV5, INV6, INV7, INV8, and INV9 included in the charge transfer control circuit 120 are powered by the power supply voltage VCC. The conventional charge transfer control circuit may include a level shifter (not shown) for shifting a voltage level of the active enable signal A_EN from the power supply voltage VCC to the high power supply voltage VPP which is greater than the power supply voltage VCC. Inverters INV5, INV6, INV7, INV8, and INV9 included in the conventional charge transfer control circuit may be powered by the high power supply voltage VPP so that a voltage transient during operation corresponds to the high power supply voltage VPP, and thus the active elements, e.g., transistors, may be damaged. Because a voltage transient between the power supply voltage VCC and the boosted power supply voltage BVCC is smaller than the voltage transient of the conventional charge transfer control circuit, the charge transfer control circuit 120 may reliably operate.

When the active enable signal A_EN is disabled to the second state, for example, the active enable signal A_EN corresponds to the logic state "low", the voltage of the fourth node N4 corresponds to the logic state "low", and thus, the third charge pump unit 122 boosts the voltage of the fifth node N5. While the active enable signal A_EN is enabled to the logic state "high", the fifth node N5 is maintained at the power supply voltage VCC because the fifth node N5 is powered by the fourth voltage supply unit 125. When the active enable signal A_EN is enabled to the second state, the third charge pump unit 122 boosts the voltage of the fifth node N5, and thus, the voltage of the fifth node N5 corresponds to the boosted power supply voltage BVCC. When the active enable signal A_EN is enabled to a second state, the fourth charge pump unit 123 does not boost the voltage of the sixth node N6, and thus, the voltage of the sixth node N6 is maintained at the power supply voltage VCC because the sixth node N6 is powered by the third voltage supply unit 124.

When the active enable signal A_EN is enabled to the first state, for example, active enable signal A_EN corresponds to the logic state "high", the voltage of the fourth node N4 corresponds to the logic state "high", and thus, the fourth charge pump unit 123 boosts the voltage of the sixth node N6. While the active enable signal A_EN is disabled, the sixth node N6 is maintained at the power supply voltage VCC because the sixth node N6 is powered by the third voltage supply unit 124. When the active enable signal A_EN is enabled to the first state, the fourth charge pump unit 123 boosts the voltage of the sixth node N6, and thus, the voltage of the sixth node N6 corresponds to the boosted power supply voltage BVCC. When the active enable signal A_EN is disabled, the third charge pump unit 122 does not boost the voltage of the fifth node N5, and thus, the voltage of the fifth node N5 is maintained at the power supply voltage VCC because the fifth node N5 is powered by the fourth voltage supply unit 125.

When the active enable signal A_EN is enabled to the first state, for example, the logic state "high", the first PMOS transistor MP1 is turned off and the ninth NMOS transistor MN9 is turned on. Thus, the seventh node N7 is connected with the ground voltage VSS through the ninth PMOS transistor MP9 so that the charge transfer control signal PTC corresponds to the ground voltage VSS.

Figure 4:
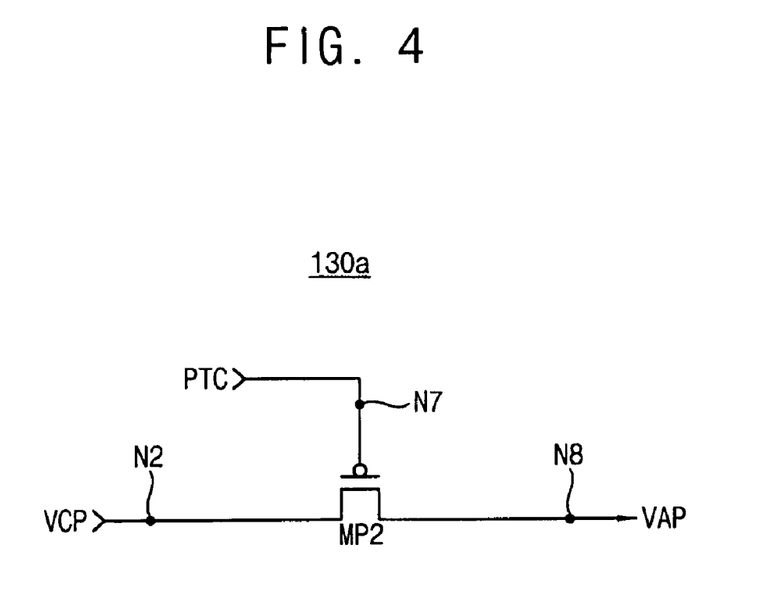
FIG 4 is a circuit diagram illustrating an example of the charge transfer circuit included in the active charge pump of FIG. 1.

FIG. 4 is a circuit diagram illustrating an example of the charge transfer circuit 130 included in the active charge pump of FIG. 1. Referring to FIG. 4, a charge transfer circuit 130a may include a second PMOS transistor MP2. The second PMOS transistor MP2 may include a control terminal to which the charge transfer control signal PTC is applied from the charge transfer control circuit 120, a first terminal to which the charge pumping voltage VCP is applied from the charge pump circuit 110, and a second terminal for outputting the active voltage VAP. The second PMOS transistor MP2 connects the second node N2 and an eighth node N8 in response to the charge transfer control signal PTC so that the second node N2 and the eighth node N8 share charges, and thus, the charge pumping voltage VCP is output at the eighth node N8 as the active voltage VAP. The active voltage VAP may correspond to the charge pumping voltage VCP, and thus, the active voltage VAP may vary between the ground voltage VSS and the boosted power supply voltage BVCC.

Figure 5:
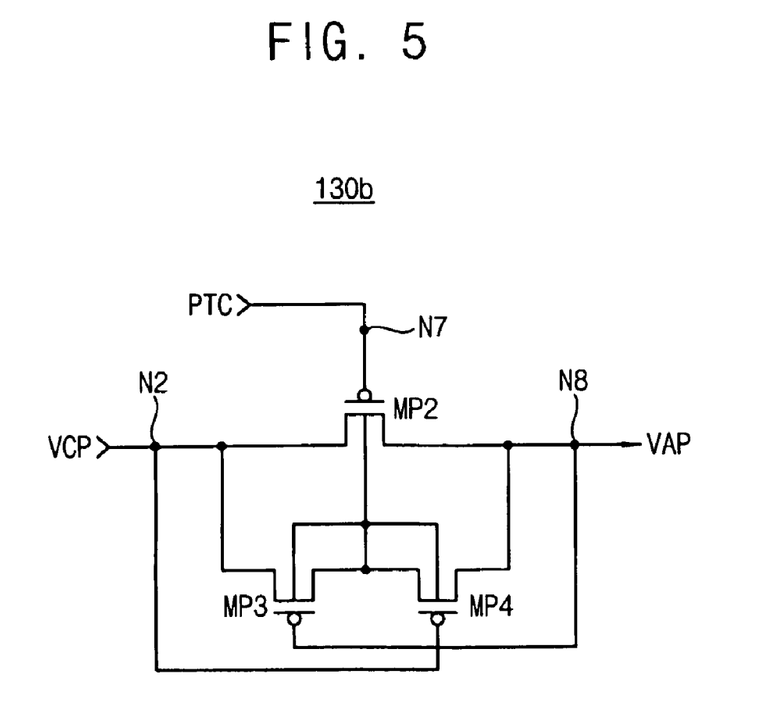
FIG. 5 is a circuit diagram illustrating another example of the charge transfer circuit included in the active charge pump of FIG. 1.

FIG. 5 is a circuit diagram illustrating another example of the charge transfer circuit 130 included in the active charge pump of FIG. 1. Referring to FIG. 5, a charge transfer circuit 130b may include a second PMOS transistor MP2, a third PMOS transistor MP3, and a fourth PMOS transistor MP4. The second PMOS transistor MP2 may include a control terminal to which the charge transfer control signal PTC is applied from the charge transfer control circuit 120, a first terminal to which the charge pumping voltage VCP is applied from the charge pump circuit 110, and a second terminal for outputting the active voltage VAP. The third PMOS transistor MP3 may include a control terminal coupled to the second terminal of the second PMOS transistor MP2, a first terminal coupled to the first terminal of the second PMOS transistor MP2, and a second terminal coupled to a body of the second PMOS transistor MP2. The fourth PMOS transistor MP4 may include a control terminal coupled to the first terminal of the second PMOS transistor MP2, a first terminal coupled to the second terminal of the second PMOS transistor MP2, and a second terminal coupled to the body of the second PMOS transistor MP2. The second PMOS transistor MP2 connects the second node N2 and an eighth node N8 in response to the charge transfer control signal PTC so that the second node N2 and the eighth node N8 share charges, and thus, the charge pumping voltage VCP is output at the eighth node N8 as the active voltage VAP.

Hereinafter, an operation of the charge transfer circuit 130b will be described. The second PMOS transistor MP2 is turned on when the charge transfer control signal PTC corresponds to the logic state "low" and turned off when the charge transfer control signal PTC corresponds to the logic state "high". For example, the logic state "high" of the charge transfer control signal PTC may correspond to the boosted power supply voltage BVCC that is twice as much as the power supply voltage VCC.

The third PMOS transistor MP3 and the fourth PMOS transistor MP4 may reduce a body effect of the second PMOS transistor MP2 by stably maintaining a voltage of the body of the second PMOS transistor MP2. The body effect represents that the threshold voltage changes depending on a source-bulk voltage corresponding to a voltage difference between the source and the body.

When the voltage of the second node N2 is greater than a voltage of the eighth node N8, the third PMOS transistor MP3 is turned on, and thus, the body of the second PMOS transistor MP2 is maintained at the voltage of the second node N2. When the voltage of the second node N2 is smaller than a voltage of the eighth node N8, the fourth PMOS transistor MP4 is turned on, and thus, the body of the second PMOS transistor MP2 is maintained at the voltage of the second node N8.

Consequently, the charge transfer circuit 130b maintains the body of the second PMOS transistor MP2 at a greater voltage among the voltage of the second node N2 and the voltage of the eighth node N8. Therefore, the charge transfer circuit 130b may stably transfer the charge pumping voltage VCP to the eighth node N8 to output the active VAP by reducing the body effect.

Figure 6:
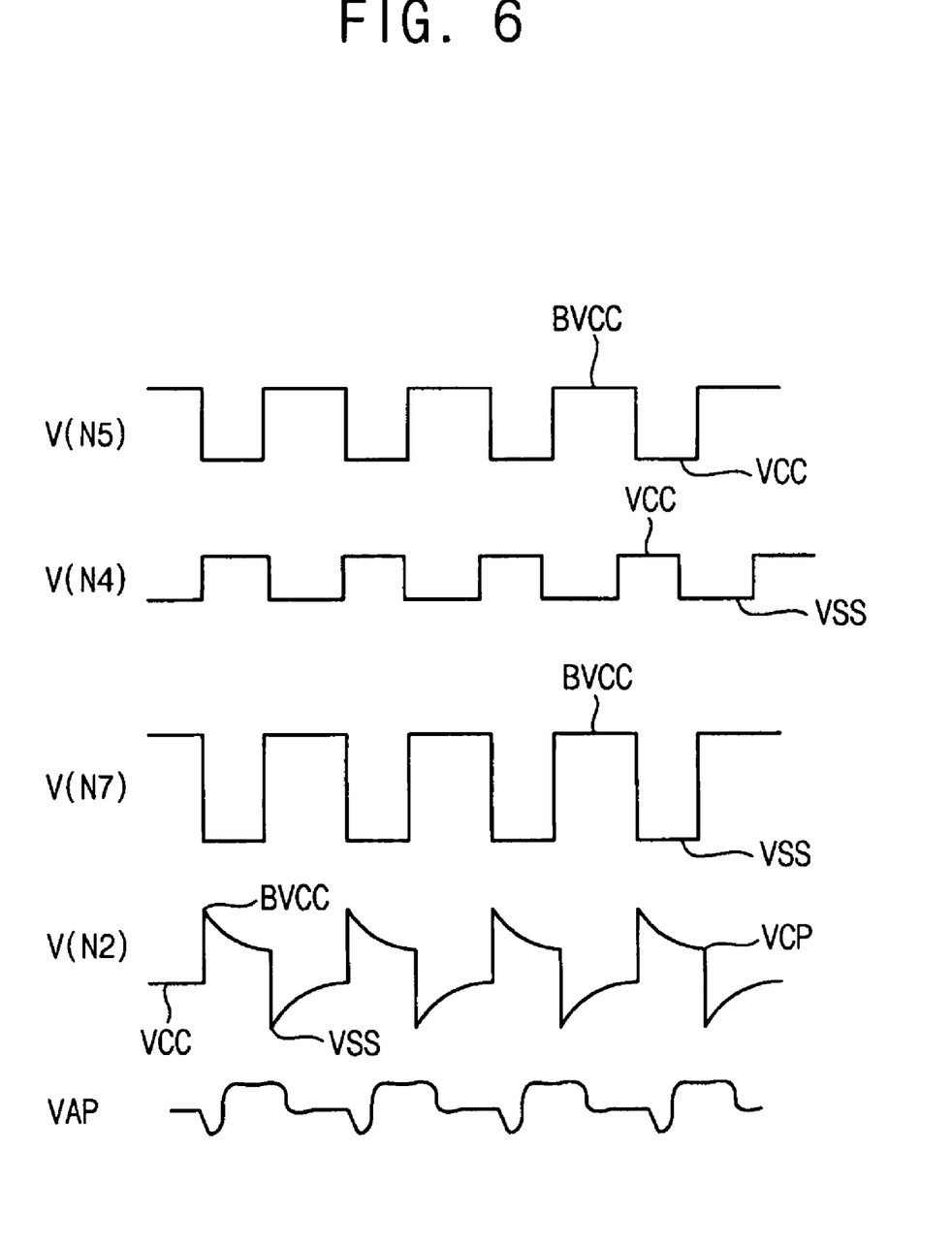
FIG. 6 is a diagram illustrating voltage variations of the active charge pump circuit of FIG. 1.

FIG. 6 is a diagram illustrating voltage variations of the active charge pump circuit of FIG. 1. With reference to FIG. 6, V(N5) represents the voltage of the fifth node N5, V(N4) represents the voltage of the fourth node N4 which corresponds to the active enable signal A_EN, V(N7) represents the voltage of the seventh node N7 which corresponds to the charge transfer control signal PTC, V(N2) represents the voltage of the second node N2 which corresponds to the charge pumping voltage VCP, and VAP represents the active voltage corresponding to the output voltage of the active charge pump circuit at the eighth node N8.

As illustrated in FIG. 6, V(N5) is a pulse waveform varying between the power supply voltage VCC and the voltage BVCC twice as much as the power supply voltage VCC, V(N4) is a pulse waveform varying between the ground voltage VSS and the power supply voltage VCC, and V(N7) is a pulse waveform varying between the ground voltage VSS and the voltage BVCC that is twice as much as the power supply voltage VCC. V(N2) is a pulse shaped pumping voltage varying between the ground voltage VSS and the boosted power supply voltage BVCC twice as much as the power supply voltage VCC. The output voltage of the active charge pump circuit 100 follows the charge pumping voltage VCP.

Figure 7:
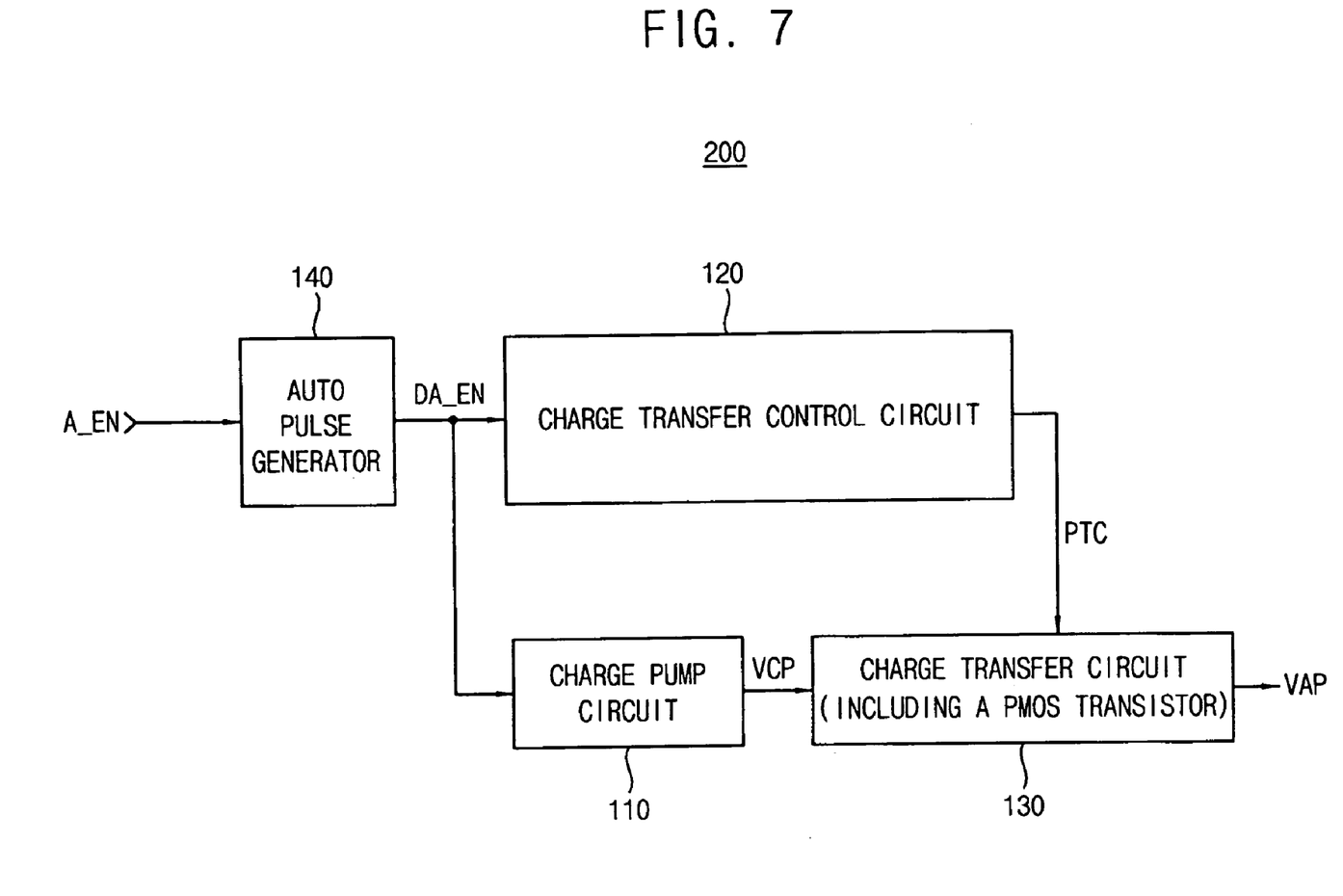
FIG. 7 is a block diagram illustrating an active charge pump circuit according to example embodiments.

FIG. 7 is a block diagram illustrating an active charge pump circuit according to example embodiments. Referring to FIG. 7, an active charge pump circuit 200 may include a charge pump circuit 110, a charge transfer control circuit 120, a charge transfer circuit 130, and an auto pulse generator 140.

The auto pulse generator 140 adjusts a duty ratio of the active enable signal A_EN, and generates the adjusted active enable signal DA_EN. The charge pump circuit 110 generates the charge pumping voltage VCP in response to the adjusted active enable signal DA_EN. The charge transfer control circuit 120 generates the charge transfer control signal PTC varying between the ground voltage VSS and the boosted power supply voltage BVCC in response to the adjusted active enable signal DA_EN. The charge transfer circuit 130 including the PMOS transistor outputs the active voltage VAP in response to the adjusted active enable signal DA_EN.

Because the active charge pump circuit 200 of FIG. 7 may operate substantially the same as the active charge pump circuit 100 of FIG. 1, the detailed description regarding an operation of the active charge pump circuit 200 will be omitted.

Figure 8:
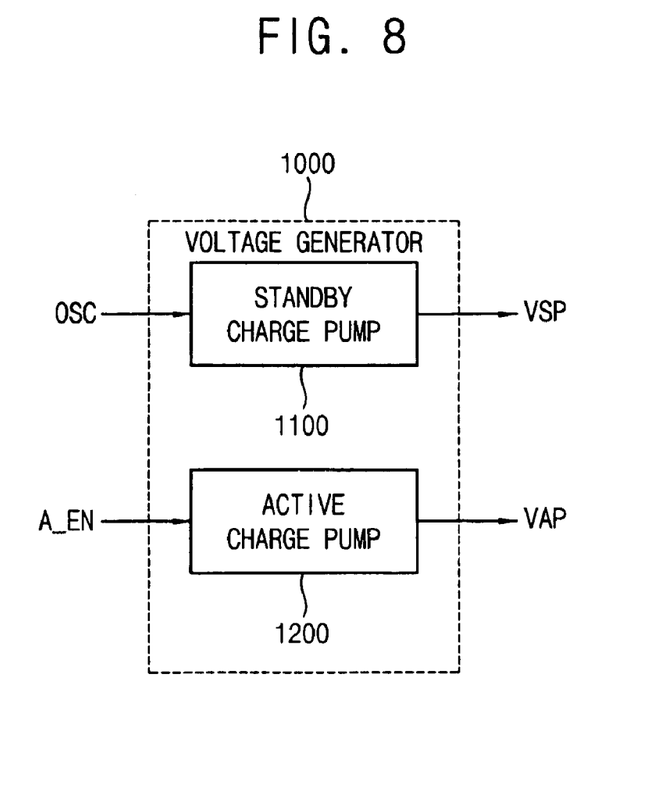
FIG. 8 is a block diagram illustrating a voltage generating circuit including the active charge pump circuit according to example embodiments.

FIG. 8 is a block diagram illustrating a voltage generating circuit including the active charge pump circuit according to example embodiments. Referring to FIG. 8, a voltage generating circuit 1000 may include a standby charge pump circuit 1100 and an active charge pump circuit 1200. The standby charge pump circuit 1100 generates a standby voltage VSP in response to an oscillation clock signal OSC during a standby mode. The oscillation clock signal OSC may be generated by a semiconductor device including the voltage generating circuit 1000. The active charge pump circuit 1200 generates a charge transfer control signal which varies between the ground voltage VSS and the boosted power supply voltage BVCC in response to the active enable signal A_EN, and the active charge pump circuit 1200 generates an active voltage VAP in response to the active enable signal A_EN during an active mode. For example, the active voltage VAP may be greater than the standby voltage VSP.

A structure of the active charge pump circuit 1200 in FIG. 8 may be substantially the same as a structure of the active charge pump circuit 100 of FIG. 1 or the active charge pump circuit 200 of FIG. 7. A structure of standby charge pump circuit 1100 may be substantially the same as the structure of the active charge pump circuit 1200.

Figure 9:
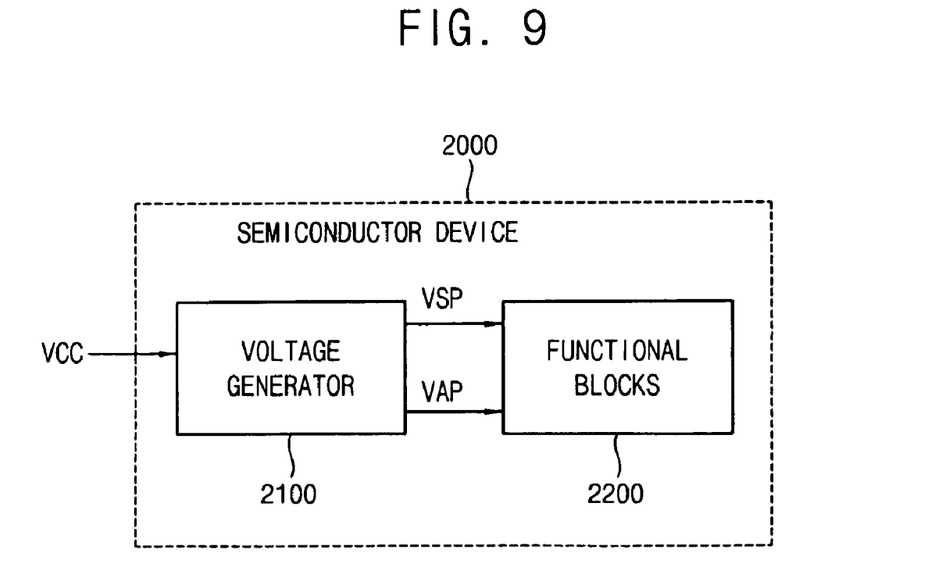
FIG 9 is a block diagram illustrating a semiconductor device including the voltage generating circuit according to example embodiments.

FIG. 9 is a block diagram illustrating a semiconductor device including the voltage generating circuit according to example embodiments. Referring to FIG. 9, a semiconductor device 2000 may include a voltage generating circuit 2100 and at least one functional block 2200. The voltage generating circuit 2100 generates a standby voltage VSP and an active voltage VAP based on the power supply voltage VCC. The functional blocks 2200 operate in response to the standby voltage VSP and the active voltage VAP. A structure of the voltage generating circuit 2100 may be substantially the same as a structure of the voltage generating circuit 1000 of FIG. 8.

As mentioned above, because the charge transfer circuit is implemented with the PMOS transistor, the voltage generating circuit including the active charge pump circuit according to example embodiments may control the charge transfer circuit based on the charge transfer control signal varying between the ground voltage VSS and the boosted power supply voltage BVCC. Therefore, the voltage generating circuit may reduce power consumption and improve reliability of the active elements implementing the voltage generating circuit. Moreover, the voltage generating circuit may reduce the body effect so that the voltage which is greater than the power supply voltage VCC is stably generated.

While example embodiments and their advantages have been described in detail, it should be understood that various changes, substitutions and alterations may be made without departing from the scope of the following claims.

What is claimed is:

1. An active charge pump circuit, comprising:
    a charge pump circuit configured to generate a charge pumping voltage in response to an active enable signal;
    a control circuit configured to generate a charge transfer control signal in response to the active enable signal, the charge transfer control signal having a voltage between a ground voltage and a boosted power supply voltage, the control circuit including,
        a first charge pump unit connected between a first node and a second node, the first charge pump unit being configured to boost a voltage of the second node based on the active enable signal, and
        a second charge pump unit connected between the first node and a third node, the second charge pump unit being configured to boost a voltage of the third node based on the active enable signal, the charge transfer control signal being based on at least one of the boosted voltages of the second and third nodes; and
    a charge transfer circuit configured to output the charge pumping voltage as an active voltage in response to the charge transfer control signal.

2. The active charge pump circuit of claim 1, wherein the charge transfer circuit comprises at least one p-type metal oxide semiconductor (PMOS) transistor.

3. The active charge pump circuit of claim 2, wherein the at least one PMOS transistor comprises:
    a first PMOS transistor including a control terminal to which the charge transfer control signal is applied, a first terminal to which the charge pumping voltage is applied, and a second terminal for outputting the active voltage;
a second PMOS transistor including a control terminal coupled to the second terminal of the first PMOS transistor, a first terminal coupled to the first terminal of the first PMOS transistor, and a second terminal coupled to a body of the first PMOS transistor; and
a third PMOS transistor including a control terminal coupled to the first terminal of the first PMOS transistor, a first terminal coupled to the second terminal of the first PMOS transistor, and a second terminal coupled to the body of the first PMOS transistor.

4. The active charge pump circuit of claim 3, wherein a body of the second PMOS transistor and a body of the third PMOS transistor are coupled to the body of the first PMOS transistor.

5. The active charge pump circuit of claim 1, wherein the charge pump circuit comprises:
a third charge pump unit connected between a fourth node and a fifth node, the third charge pump unit being configured to boost a voltage of the fifth node when the active enable signal is enabled;
a fourth charge pump unit connected between the fourth node and a sixth node, the fourth charge pump unit being configured to boost a voltage of the sixth node when the active enable signal is disabled;
a first power supply unit configured to apply a power supply voltage to the sixth node in response to the boosted voltage of the fifth node; and
a second power supply unit configured to apply the power supply voltage to the fifth node in response to the boosted voltage of the sixth node.

6. An active charge pump circuit, comprising:
a charge pump circuit configured to generate a charge pumping voltage in response to an active enable signal;
a control circuit configured to generate a charge transfer control signal in response to the active enable signal, the charge transfer control signal having a voltage between a ground voltage and a boosted power supply voltage, the control circuit including,
a first charge pump unit connected between a first node and a second node, the first charge pump unit being configured to boost a voltage of the second node when the active enable signal is disabled,
a second charge pump unit connected between the first node and a third node, the second charge pump unit being configured to boost a voltage of the third node when the active enable signal is enabled,
a first power supply unit configured to apply a power supply voltage to the third node in response to the boosted voltage of the second node,
a second power supply unit configured to apply the power supply voltage to the second node in response to the boosted voltage of the third node, and
a switching unit connected to the second node, the switching unit being configured to generate the charge transfer control signal in response to the active enable signal; and
a charge transfer circuit configured to output the charge pumping voltage as an active voltage in response to the charge transfer control signal.

7. The active charge pump circuit of claim 6, wherein the switching unit comprises:
a PMOS transistor including a control terminal to which the active enable signal is applied, a first terminal coupled to the second node, and a second terminal for outputting the charge transfer control signal; and
an n-type metal oxide semiconductor (NMOS) transistor including a control terminal to which the active enable signal is applied, a first terminal coupled to a ground voltage, and a second terminal coupled to the second terminal of the PMOS transistor.

8. The active charge pump circuit of claim 6, wherein the first charge pump unit comprises:
an inverter configured to invert the active enable signal, the inverter being powered by the power supply voltage; and
a capacitor configured to boost the voltage of the second node in response to an output signal of the inverter.

9. The active charge pump circuit of claim 6, wherein the second charge pump unit comprises:
a first inverter configured to invert the active enable signal, the first inverter being powered by the power supply voltage;
a second inverter configured to invert an output signal of the first inverter, the second inverter being powered by the power supply voltage; and
a capacitor configured to boost the voltage of the third node in response to an output signal of the second inverter.

10. The active charge pump circuit of claim 6, wherein the control circuit further comprises:
a buffer configured to temporarily hold the active enable signal and output the delayed active enable signal at the first node.

11. The active charge pump circuit of claim 10, wherein the buffer comprises at least one inverter powered by the power supply voltage.

12. The active charge pump circuit of claim 1, further comprising:
an auto pulse generator configured to adjust a duty ratio of the active enable signal and provide the adjusted active enable signal to the control circuit and the charge pump circuit.

13. A voltage generating circuit, comprising:
a standby charge pump circuit configured to generate a standby voltage in a standby mode; and
an active charge pump circuit configured to generate a charge transfer control signal in response to an active enable signal, and output an active voltage in response to the charge transfer control signal, the charge transfer control signal having a voltage between a ground voltage and a boosted power supply voltage, the active charge pump circuit including,
a charge pump circuit configured to generate a charge pumping voltage in response to the active enable signal,
a control circuit configured to generate the charge transfer control signal, the control circuit including,
a first charge pump unit connected between a first node and a second node, the first charge pump unit being configured to boost a voltage of the second node based on the active enable signal, and
a second charge pump unit connected between the first node and a third node, the second charge pump unit being configured to boost a voltage of the third node based on the active enable signal, the charge transfer control signal being based on at least one of the boosted voltages of the second and third nodes, and
a charge transfer circuit configured to output the charge pumping voltage as the active voltage in response to the charge transfer control signal.

14. The voltage generating circuit of claim 13, wherein the charge transfer circuit comprises at least one PMOS transistor.

15. The voltage generating circuit of claim 14, wherein the at least one PMOS transistor comprises:
- a first PMOS transistor including a control terminal to which the charge transfer control signal is applied, a first terminal to which the charge pumping voltage is applied, and a second terminal for outputting the active voltage;
- a second PMOS transistor including a control terminal coupled to the second terminal of the first PMOS transistor, a first terminal coupled to the first terminal of the first PMOS transistor, and a second terminal coupled to a body of the PMOS transistor; and
- a third PMOS transistor including a control terminal coupled to the first terminal of the first PMOS transistor, a first terminal coupled to the second terminal of the PMOS transistor, and a second terminal coupled to a body of the first PMOS transistor.

16. A semiconductor device, comprising:
- the voltage generating circuit of claim 13 configured to generate the standby voltage and the active voltage based on the power supply voltage; and
- at least one functional block configured to operate in response to the standby voltage and the active voltage.

17. The semiconductor device of claim 16, wherein the charge transfer circuit comprises at least one PMOS transistor.

18. The semiconductor device of claim 17, wherein the at least one PMOS transistor comprises:
- a first PMOS transistor including a control terminal to which the charge transfer control signal is applied, a first terminal to which the charge pumping voltage is applied, and a second terminal for outputting the active voltage;
- a second PMOS transistor including a control terminal coupled to the second terminal of the first PMOS transistor, a first terminal coupled to the first terminal of the first PMOS transistor, and a second terminal coupled to a body of the first PMOS transistor; and
- a third PMOS transistor including a control terminal coupled to the first terminal of the first PMOS transistor, a first terminal coupled to the second terminal of the first PMOS transistor, and a second terminal coupled to a body of the first PMOS transistor.

19. The active charge pump circuit of claim 1, wherein the control circuit includes active elements, all of the active elements being powered by the power supply voltage.

20. The active charge pump circuit of claim 1, wherein the control circuit is configured to generate the charge transfer control signal as a binary signal.

21. The active charge pump circuit of claim 20, wherein the control circuit is configured to generate the charge transfer control signal, the charge transfer control signal alternating between the ground voltage and the boosted voltage.

22. The active charge pump circuit of claim 1, wherein the control circuit is configured to generate the charge transfer control signal, the charge transfer control signal alternating between the ground voltage and the boosted voltage.

23. The voltage generating circuit of claim 13, wherein the active charge pump includes a control circuit having active elements, all of the active elements being powered by the power supply voltage.

24. The voltage generating circuit of claim 13, wherein the voltage generating circuit is configured to generate the charge transfer control signal as a binary signal.

25. The voltage generating circuit of claim 24, wherein the voltage generating circuit is configured to generate the charge transfer control signal, the charge transfer control signal alternating between the ground voltage and the boosted voltage.

26. The voltage generating circuit of claim 13, wherein the voltage generating circuit is configured to generate the charge transfer control signal, the charge transfer control signal alternating between the ground voltage and the boosted voltage.

27. The active charge pump circuit of claim 1, wherein
- the first charge pump unit includes at least one inverter configured to receive the power supply voltage, and
- the second charge pump unit includes at least one inverter configured to receive the power supply voltage.

28. The voltage generating circuit of claim 13, wherein
- the first charge pump unit includes at least one inverter configured to receive the power supply voltage, and
- the second charge pump unit includes at least one inverter configured to receive the power supply voltage.

* * * * *